US012684883B2

(12) United States Patent
Yang et al.

(10) Patent No.: US 12,684,883 B2
(45) Date of Patent: Jul. 14, 2026

(54) IMAGE SENSOR, IMAGE DATA OBTAINING METHOD, AND IMAGING DEVICE

(71) Applicant: HUAWEI TECHNOLOGIES CO., LTD., Shenzhen (CN)

(72) Inventors: Zilu Yang, Beijing (CN); Xuanwu Yin, Shenzhen (CN); Guo Li, Beijing (CN); Yamin Sun, Beijing (CN); Wenming Zuo, Beijing (CN); Yunlong Zhan, Beijing (CN); Xiandou Zhang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 292 days.

(21) Appl. No.: 18/470,847

(22) Filed: Sep. 20, 2023

(65) Prior Publication Data

US 2024/0014233 A1     Jan. 11, 2024

Related U.S. Application Data

(63) Continuation of application No. PCT/CN2021/082350, filed on Mar. 23, 2021.

(51) Int. Cl.
*H10F 39/00*          (2025.01)
*H04N 25/13*          (2023.01)

(52) U.S. Cl.
CPC ......... *H10F 39/8053* (2025.01); *H04N 25/13* (2023.01)

(58) Field of Classification Search
CPC .... H10F 39/8053; H04N 25/13; H04N 23/12; H04N 25/11; H04N 25/703; H04N 23/88;

(Continued)

(56) References Cited

U.S. PATENT DOCUMENTS

| | | | |
|---|---|---|---|
| 2009/0256927 A1 | 10/2009 | Komiya et al. | |
| 2010/0265342 A1 | 10/2010 | Liang et al. | |

(Continued)

FOREIGN PATENT DOCUMENTS

| | | |
|---|---|---|
| DE | 102008011793 A1 | 9/2009 |
| KR | 101243285 B1 | 3/2013 |

OTHER PUBLICATIONS

International Search Report and Written Opinion in International Appln. No. PCT/CN2021/082350, mailed on Dec. 22, 2021, 20 pages (with English translation).

(Continued)

*Primary Examiner* — Lin Ye
*Assistant Examiner* — Tuan H Le
(74) *Attorney, Agent, or Firm* — Fish & Richardson P.C.

(57)          ABSTRACT

An image sensor includes a pixel array and a color filter array covering the pixel array, where the color filter array includes a plurality of color filter elements, the plurality of color filter elements include at least one first color filter element and at least one second color filter element, each first color filter element includes a basic color filter and an extended color filter, and each second color filter element includes a plurality of basic color filters. A color of the extended color filter is different from a color of the basic color filter. An optical signal passing through the basic color filter is at least for imaging, and an optical signal passing through the extended color filter is for spectral measurement.

20 Claims, 5 Drawing Sheets

(58) Field of Classification Search
CPC ............ H04N 25/135; G01J 2003/2806; G01J
2003/2826; G01J 3/2803
See application file for complete search history.

(56) References Cited

U.S. PATENT DOCUMENTS

| | | | |
|---|---|---|---|
| 2011/0211099 A1* | 9/2011 | Nayar ................... | H04N 25/135 |
| | | | 348/278 |
| 2011/0234845 A1 | 9/2011 | Fujiwara et al. | |
| 2015/0070528 A1 | 3/2015 | Kikuchi | |
| 2015/0281666 A1 | 10/2015 | Chen et al. | |
| 2019/0004222 A1* | 1/2019 | Hwang ..................... | G01J 3/12 |
| 2020/0400570 A1 | 12/2020 | Talbert et al. | |

OTHER PUBLICATIONS

Extended European Search Report in European Appln. No. 21932068.
6, mailed on Dec. 21, 2023, 15 pages.

* cited by examiner

101

| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |

| R | R | R | R | G | G | G | G |
| R | R | R | R | G | G | G | G |
| R | R | R | R | G | G | G | G |
| R | R | R | R | G | G | G | G |
| Y | Y | Y | Y | B | B | B | B |
| Y | Y | Y | Y | B | B | B | B |
| Y | Y | Y | Y | B | B | B | B |
| Y | Y | Y | Y | B | B | B | B |

IMAGE SENSOR, IMAGE DATA OBTAINING METHOD, AND IMAGING DEVICE

CROSS-REFERENCE TO RELATED APPLICATIONS

This application is a continuation of International Application No. PCT/CN2021/082350, filed on Mar. 23, 2021, the disclosure of which is hereby incorporated by reference in its entirety.

TECHNICAL FIELD

This application relates to the field of image processing technologies, and in particular, to an image sensor, an image data obtaining method, and an imaging device.

BACKGROUND

With the popularization of digital cameras and mobile phones, an image sensor (CCD/CMOS) has drawn wide attention and been widely used in recent years. A common image sensor includes a color filter array. The color filter array includes a plurality of same color filter elements, and each color filter element includes a plurality of color filters.

Because color filter elements included in a common color filter array are the same, and each color filter element includes color filters of three or four colors. In other words, the color filter array has only three or four sampling points. However, in an actual scenario, any micro light intensity change on a spectrum may cause a visual color change of human eyes. Therefore, only rough color reproduction can be performed by using the common image sensor. In addition, a manner of restoring a spectrum that is from 400 nm to 700 nm by using three or four sampling points causes many metamerism problems, and brings a challenge to calculation of a white balance coefficient and a color reproduction matrix.

SUMMARY

This application provides an image sensor, an image data obtaining method, and an imaging device, to resolve a problem that a common image sensor can only perform rough color reproduction, there are a large quantity of metamerism, and calculation of a white balance coefficient and a color conversion matrix becomes more challenging.

According to a first aspect, this application provides an image sensor, including a pixel array and a color filter array covering the pixel array, where the color filter array includes a plurality of color filter elements, the plurality of color filter elements include at least one first color filter element and at least one second color filter element, each first color filter element includes a basic color filter and an extended color filter, and each second color filter element includes a plurality of basic color filters. A color of the extended color filter is different from a color of the basic color filter. An optical signal passing through the basic color filter is at least for imaging. An optical signal passing through the extended color filter is for spectral measurement.

Because the first color filter element includes the basic color filter and the extended color filter, the second color filter element includes the plurality of basic color filters, and the color of the extended color filter is different from the color of the basic color filter, a color combination of the color filter in the first color filter element is different from a color combination of the color filter in the second color filter element. In other words, the color filter array includes two types of color filter elements. Compared with a common color filter array that includes a plurality of same color filter elements, this color filter array increases sampling points, improves color reproduction precision, reduces occurrence of a metamerism problem, and reduces difficulty in calculating a white balance coefficient and a color conversion matrix. In addition, compared with a related technology, the color filter array is improved and no additional component is added. This facilitates miniaturization and low-cost popularization of the image sensor, and enables the image sensor to be conveniently used in a use scenario of a mobile terminal device, for example, a mobile phone or the like. In addition, because the optical signal passing through the basic color filter is at least for the imaging, and the optical signal passing through the extended color filter is for the spectral measurement, both the imaging and the spectral measurement may be performed through one exposure, and time consumed for the spectral measurement is shortened. This improves efficiency of the color reproduction and imaging that are of the image sensor.

In a possible implementation, a quantity of basic color filters in each first color filter element is 3, a quantity of extended color filters in each first color filter element is 1, and a quantity of basic color filters in each second color filter element is 4.

In a possible implementation, colors of the basic color filters in the second color filter element include red, green, and blue. Colors of the basic color filters in the first color filter element include red, green, and blue.

In a possible implementation, different extended color filters have different colors.

Because different extended color filters have different colors, a quantity of sampling points is further increased, the color reproduction precision is improved, the occurrence of the metamerism problem is reduced, and the difficulty in calculating the white balance coefficient and the color reproduction matrix is reduced.

In a possible implementation, the extended color filter includes a first extended color filter and a second extended color filter, where at least one of a thickness of the first extended color filter, an effective area of a pixel covered by the first extended color filter, and exposure time of the pixel covered by the first extended color filter is determined based on an upper limit of a dynamic range of the image sensor, and at least one of a thickness of the second extended color filter, an effective area of a pixel covered by the second extended color filter, and exposure time of the pixel covered by the second extended color filter is determined based on a lower limit of the dynamic range of the image sensor.

It can be learned from the above that, related parameters that are of the first extended color filter, the pixel covered by the first extended color filter, the second extended color filter, and the pixel covered by the second extended color filter may be determined based on the upper limit and the lower limit of the dynamic range of the image sensor. In this way, the dynamic range of the image sensor is not limited, to consider both a dynamic range of an object with higher illumination and a dynamic range of an object with lower illumination. This improves an imaging effect.

According to a second aspect, this application provides an image data obtaining method, applied to an image sensor. The image sensor includes a pixel array and a color filter array covering the pixel array. The color filter array includes a plurality of color filter elements. The plurality of color filter elements include at least one first color filter element and at least one second color filter element. Each first color filter element includes a basic color filter and an extended color filter. Each second color filter element includes a plurality of basic color filters. A color of the extended color filter is different from a color of the basic color filter.

The method includes: obtaining a first electrical signal and a second electrical signal, and determining first spectral measurement data of a current frame based on the first electrical signal, and determining imaging data of the current frame based on the second electrical signal, where the first electrical signal is an electrical signal obtained by performing optical-to-electrical conversion on a first optical signal by a first pixel, the first optical signal is an optical signal that passes through the extended color filter, the first pixel is a pixel covered by the extended color filter, the second electrical signal is an electrical signal obtained by performing optical-to-electrical conversion on a second optical signal by a second pixel, the second optical signal is an optical signal that passes through the basic color filter, and the second pixel is a pixel covered by the basic color filter.

It can be learned from the above that, both the imaging data and the first spectral measurement data that are of the current frame can be obtained through one exposure, to shorten time consumed for data collection. In addition, because sampling points of the image sensor to which the image data obtaining method is applied are increased, color reproduction precision is improved, and difficulty in calculating a white balance coefficient and color conversion precision is reduced.

In a possible implementation, the determining first spectral measurement data of a current frame based on the first electrical signal includes: determining motion information of the current frame relative to a history frame based on the imaging data of the current frame and imaging data of the history frame; determining second spectral measurement data of the current frame based on the first electrical signal; and correcting the second spectral measurement data based on the motion information and spectral measurement data of the history frame, to obtain the first spectral measurement data.

In a possible implementation, the determining first spectral measurement data of a current frame based on the first electrical signal includes: generating the first spectral measurement data based on at least a part of the second electrical signal and the first electrical signal.

In a possible implementation, the determining first spectral measurement data of a current frame based on the first electrical signal includes: determining motion information of the current frame relative to a history frame based on the imaging data of the current frame and imaging data of the history frame; generating second spectral measurement data of the current frame based on at least a part of the second electrical and the first electrical signal; and correcting the second spectral measurement data based on the motion information and spectral measurement data of the history frame, to obtain the first spectral measurement data.

In a possible implementation, the obtaining a first electrical signal and a second electrical signal includes: obtaining the first electrical signal based on a location of the extended color filter in the color filter array; and obtaining the second electrical signal based on a location of the basic color filter in the color filter array.

In a possible implementation, the method further includes: performing element segmentation on the current frame based on the imaging data of the current frame to obtain at least one object in the current frame; determining an original light source spectrum of the current frame based on color distribution of the at least one object; determining spectral measurement data of each object from the first spectral measurement data of the current frame, and correcting the original light source spectrum based on the spectral measurement data of each object, to obtain a target light source spectrum; determining a white balance coefficient and/or a color conversion matrix of the current frame based on the target light source spectrum; and processing the imaging data of the current frame based on the white balance coefficient and/or the color conversion matrix of the current frame.

In a possible implementation, the method further includes: performing element segmentation on the current frame based on the imaging data of the current frame to obtain the at least one object in the current frame; determining the spectral measurement data of each object from the first spectral measurement data of the current frame, and determining a spectrum of each object based on the spectral measurement data of each object; and diagnosing and/or classifying and/or identifying a corresponding object based on the spectrum of each object.

In a possible implementation, the extended color filter includes a first extended color filter and a second extended color filter, where at least one of a thickness of the first extended color filter, an effective area of a pixel covered by the first extended color filter, and exposure time of the pixel covered by the first extended color filter is determined based on an upper limit of a dynamic range of the image sensor, and at least one of a thickness of the second extended color filter, an effective area of a pixel covered by the second extended color filter, and exposure time of the pixel covered by the second extended color filter is determined based on a lower limit of the dynamic range of the image sensor.

According to a third aspect, this application provides an imaging device, including an image sensor and an image processor. The image sensor includes a pixel array and a color filter array covering the pixel array. The color filter array includes a plurality of color filter elements, the plurality of color filter elements include at least one first color filter element and at least one second color filter element, each first color filter element includes a basic color filter and an extended color filter, each second color filter element includes a plurality of basic color filters, and a color of the extended color filter is different from a color of the basic color filter. The extended color filter is configured to filter an incident optical signal to obtain a first optical signal. The basic color filter is configured to filter the incident optical signal to obtain a second optical signal. A first pixel is configured to perform optical-to-electrical conversion on the first optical signal to obtain a first electrical signal, where the first pixel is a pixel covered by the extended color filter. A second pixel is configured to perform optical-to-electrical conversion on the second optical signal to obtain a second electrical signal, where the second pixel is a pixel covered by the basic color filter. The image processor is configured to: obtain the first electrical signal and the second electrical signal, determine first spectral measurement data of a current frame based on the first electrical signal, and determine imaging data of the current frame based on the second electrical signal.

In a possible implementation, the image processor specifically determines the first spectral measurement data in the following manners: determining motion information of the current frame relative to a history frame based on the imaging data of the current frame and imaging data of the history frame; determining second spectral measurement data of the current frame based on the first electrical signal; and correcting the second spectral measurement data based on the motion information and spectral measurement data of the history frame, to obtain the first spectral measurement data.

In a possible implementation, the image processor specifically determines the first spectral measurement data in the following manner: generating the first spectral measurement data based on at least a part of the second electrical signal and the first electrical signal.

In a possible implementation, the image processor specifically determines the first spectral measurement data in the following manners: determining motion information of the current frame relative to a history frame based on the imaging data of the current frame and imaging data of the history frame; generating second spectral measurement data of the current frame based on at least a part of the second electrical and the first electrical signal; and correcting the second spectral measurement data based on the motion information and spectral measurement data of the history frame, to obtain the first spectral measurement data.

In a possible implementation, the image processor specifically obtains the first electrical signal and the second electrical signal in the following manners: obtaining the first electrical signal based on a location of the extended color filter in the color filter array; and obtaining the second electrical signal based on a location of the basic color filter in the color filter array.

In a possible implementation, the image processor is further configured to: perform element segmentation on the current frame based on the imaging data of the current frame to obtain at least one object in the current frame, determine an original light source spectrum of the current frame based on color distribution of the at least one object, determine spectral measurement data of each object from the first spectral measurement data of the current frame, and correct the original light source spectrum based on the spectral measurement data of each object, to obtain a target light source spectrum, determine a white balance coefficient and/or a color conversion matrix of the current frame based on the target light source spectrum, and process the imaging data of the current frame based on the white balance coefficient and/or the color conversion matrix of the current frame.

In a possible implementation, the image processor is further configured to: perform element segmentation on the current frame based on the imaging data of the current frame to obtain the at least one object in the current frame, determine the spectral measurement data of each object from the first spectral measurement data of the current frame, and determine a spectrum of each object based on the spectral measurement data of each object, and diagnose and/or classify and/or identify a corresponding object based on the spectrum of each object.

In a possible implementation, the extended color filter includes a first extended color filter and a second extended color filter, where at least one of a thickness of the first extended color filter, an effective area of a pixel covered by the first extended color filter, and exposure time of the pixel covered by the first extended color filter is determined based on an upper limit of a dynamic range of the image sensor, and at least one of a thickness of the second extended color filter, an effective area of a pixel covered by the second extended color filter, and exposure time of the pixel covered by the second extended color filter is determined based on a lower limit of the dynamic range of the image sensor.

According to a fourth aspect, this application provides a computer-readable storage medium. The computer-readable storage medium stores instructions, and when the instructions are run on a computer or a processor, the computer or the processor is enabled to perform the method according to any one of the implementations of the second aspect.

According to a fifth aspect, this application provides a computer program product including instructions. When the computer program product runs on a computer or a processor, the computer or the processor is enabled to perform the method according to any one of the implementations of the second aspect.

DESCRIPTION OF EMBODIMENTS

The following describes technical solutions of this application with reference to accompanying drawings.

To make the objectives, technical solutions, and advantages of this application clearer, the following clearly and describes the technical solutions of this application with reference to the accompanying drawings in embodiments of this application. Clearly, the described embodiments are merely a part rather than all of embodiments of this application. All other embodiments obtained by a person of ordinary skill in the art based on embodiments of this application without creative efforts shall fall within the protection scope of this application.

In this specification, embodiments, claims, and accompanying drawings of this application, terms "first", "second", and the like are merely intended for distinguishing and description, and shall not be understood as an indication or implication of relative importance or an indication or implication of an order. In addition, the terms "include", "have", and any variant thereof are intended to cover non-exclusive inclusion, for example, include a series of steps or elements. Methods, systems, products, or devices are not necessarily limited to those steps or units that are literally listed, but may include other steps or units that are not literally listed or that are inherent to such processes, methods, products, or devices.

It should be understood that, in this application, "at least one (item)" means one or more, and "a plurality of" means two or more. The term "and/or" is used for describing an association relationship between associated objects, and represents that three relationships may exist. For example, "A and/or B" may represent the following three cases: Only A exists, only B exists, and both A and B exist, where A and B may be singular or plural. The character "/" generally indicates an "or" relationship between the associated objects. "At least one of the following" or a similar expression thereof indicates any combination of the following, including any combination of one or more of the following. For example, at least one of a, b, or c may indicate a, b, c, "a and b", "a and c", "b and c", or "a, b, and c", where a, b, and c may be singular or plural.

A common image sensor includes a pixel array and a color filter array covering the pixel array.

Figures 1, 2:
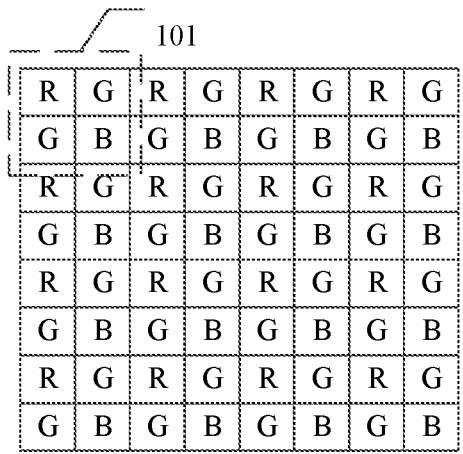
FIG. 1 is a first schematic diagram of a structure of a common color filter array.
FIG. 2 is a second schematic diagram of a structure of a common color filter array.

FIG. 1 is a first schematic diagram of a structure of a common color filter array. As shown in FIG. 1, the color filter array includes 16 same color filter elements 101, and the 16 color filter elements 101 are arranged in four rows and four columns. Each color filter element 101 includes four color filters, and the four color filters are arranged in two rows and two columns. The color filter element 101 is a three-channel RGB, to be specific, the color filter element 101 includes color filters of three colors, where colors of the four color filters that are included in the color filter element 101 are respectively red R, green G, green G, and blue B.

FIG. 2 is a second schematic diagram of a structure of a common color filter array. As shown in FIG. 2, the color filter array includes one color filter element. The color filter element includes 64 color filters. The color filter element is a four-channel RGYB, in other words, the color filter element includes color filters of four colors. The 64 color filters in the color filter element are classified into four filter groups, and each filter group includes 16 color filters. The four filter groups are arranged in two rows and two columns, and the 16 color filters in each filter group are arranged in four rows and four columns. A color of a color filter in a first filter group is red R, a color of a color filter in a second filter group is green G, a color of a color filter in a third filter group is yellow Y, and a color of a color filter in a fourth filter group is blue B.

In conclusion, the common color filter array includes a plurality of same color filter elements, and each color filter element usually is a three-channel element or a four-channel element. Therefore, it is equivalent to that the color filter array has only three or four sampling points. There are a small quantity of sampling points. Consequently, only rough color reproduction can be performed by a common image sensor. In addition, a small quantity of sampling points causes a more serious problem of metamerism, and brings a challenge to calculating a white balance coefficient and a color conversion matrix.

To resolve the foregoing technical problem, a related technology provides an image sensor. A grating device is added to the image sensor based on the common image sensor. In this way, when the image sensor performs imaging, optical splitting may further be performed on an incident light by the grating device to implement spectral measurement, and a color reproduction process of the image sensor and calculation of a white balance coefficient and a color conversion matrix is assisted by a spectral measurement result.

Clearly, the grating device is used, and the sampling points are increased, so that color reproduction precision of the image sensor is improved, occurrence of the metamerism problem is reduced, and difficulty in calculating the white balance coefficient and the color conversion matrix is reduced.

Although the sampling points can be increased by using the grating device, the grating device is added on a basis of a common structure. Because the grating device has a large size and a high price, it is not conducive to miniaturization and low-cost popularization of the image sensor. In addition, in a case of vibration, reliability of the grating device is affected. This does not satisfy a usage scenario of a mobile terminal device, for example, a mobile phone. In addition, the grating device takes long time to perform spectral measurement once. This reduces efficiency of the color reproduction and imaging of the image sensor.

Figure 3:
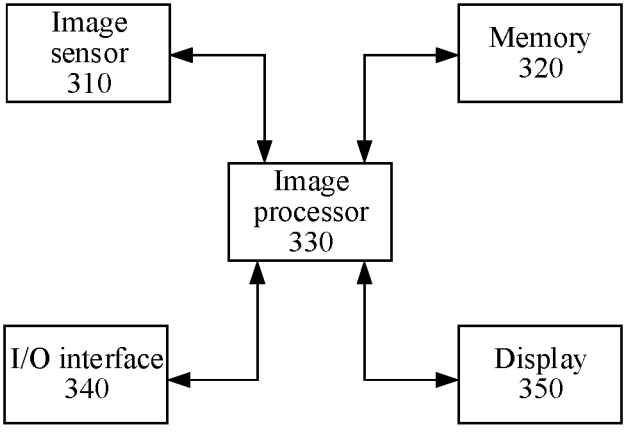
FIG. 3 is a schematic diagram of a structure of an imaging device according to an embodiment of this application.

To resolve the foregoing technical problem, this application provides an imaging device. FIG. 3 is a schematic diagram of a structure of an imaging device according to an embodiment of this application. As shown in FIG. 3, the imaging device includes an image sensor 310, a memory 320, an image processor 330, an I/O interface 340, and a display 350.

The image sensor 310 may also be referred to as an imaging sensor, and the imaging sensor is a sensor that senses and transmits image information. The image sensor 310 may be used in an electronic imaging device, including a digital camera, a camera module, a medical imaging device, a night vision device, for example, a thermal imaging device, a radar, or a sonar, and the like. For example, the image sensor 310 may be an active pixel sensor in a complementary metal oxide semiconductor (Complementary Metal Oxide Semiconductor, CMOS) technology or an n-type metal oxide semiconductor (N-type Metal Oxide Semiconductor, NMOS) technology, and embodiments of the present application are not limited thereto. For example, the image sensor 310 may alternatively be a charge-coupled device (Charge-Coupled Device, CCD), or the like.

Figure 4:
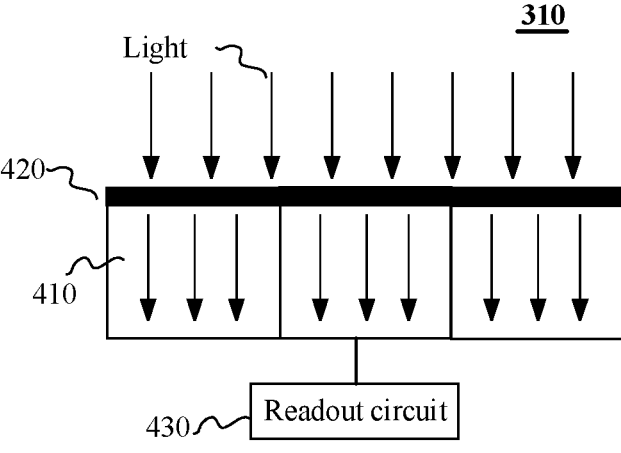
FIG. 4 is a schematic diagram of a structure of an image sensor according to an embodiment of this application.

FIG. 4 is a schematic diagram of a structure of an image sensor according to an embodiment of this application. As shown in FIG. 4, the image sensor 310 includes a pixel array 410, a color filter array 420 that covers the pixel array 410, and a readout circuit 430.

The color filter array 420 includes a plurality of color filter elements. The plurality of color filter elements include at least one first color filter element and at least one second color filter element. Each first color filter element includes a basic color filter and an extended color filter, and each second color filter element includes a plurality of basic color filters. A color of the extended color filter is different from a color of the basic color filter.

The extended color filter is configured to filter an incident light (to be specific, enable a light that is of the light and that is within a passband range of the extended color filter to pass through), to obtain a first optical signal. The first optical signal (to be specific, an optical signal that passes through the extended color filter) is for spectral measurement.

The basic color filter is configured to filter an incident optical signal (to be specific, enable a light that is of the light and that is within a passband range of the basic color filter to pass through), to obtain a second optical signal. The second optical signal (to be specific, an optical signal that passes through the basic color filter) is for imaging or the spectral measurement.

The pixel array 410 includes a plurality of pixels, where a pixel covered by the extended color filter is referred to as a first pixel, and a pixel covered by the basic color filter is referred to as a second pixel. The first pixel is configured to perform optical-to-electrical conversion on the first optical signal to obtain a first electrical signal. The second pixel is configured to perform optical-to-electrical conversion on the second optical signal to obtain a second electrical signal.

The readout circuit 430 is configured to read out the first electrical signal from the first pixel and read out the second electrical signal from the second pixel.

The image processor 330 is configured to: obtain the first electrical signal and the second electrical signal, determine first spectral measurement data of a current frame based on the first electrical signal, and determine imaging data of the current frame based on the second electrical signal. The image processor 330 may further determine a white balance coefficient of the current frame and/or color conversion matrices of the current frame, and/or diagnose and/or classify and/or identify an object in the current frame, based on the first spectral data and the imaging data of the current frame.

The memory 320 is configured to store data corresponding to a signal that is output by the image sensor 310. The display 350 is configured to display an image and/or a spectrum based on data corresponding to the signal output by the image sensor 310 or a signal stored in the memory 320. The I/O interface 340 is configured to communicate with another electronic device, for example, a mobile phone, a smartphone, a phablet, a tablet, or a personal computer.

In addition to the above imaging device, it will be understood by those skilled in the art that the techniques disclosed herein are also applicable to other electronic devices with an imaging function, such as a mobile phone, a smart phone, a phablet, a tablet, a personal assistant, and the like.

It can be learned from the above that, because the first color filter element includes the basic color filter and the extended color filter, the second color filter element includes the plurality of basic color filters, and the color of the extended color filter is different from the color of the basic color filter, a color combination of the color filter in the first color filter element is different from a color combination of the color filter in the second color filter element. In other words, the color filter array includes two types of color filter elements. Compared with a common color filter array that includes a plurality of same color filter elements, this color filter array increases sampling points, improves color reproduction precision, reduces occurrence of a metamerism problem, and reduces difficulty in calculating a white balance coefficient and a color conversion matrix. In addition, compared with a related technology, the color filter array is improved and no additional component is added. This facilitates miniaturization and low-cost popularization of the image sensor, and enables the image sensor to be conveniently used in a use scenario of a mobile terminal device, for example, a mobile phone or the like. In addition, because the optical signal passing through the basic color filter is at least for the imaging, and the optical signal passing through the extended color filter is for the spectral measurement, both the imaging and the spectral measurement may be performed through one exposure, and time consumed for the spectral measurement is shortened. This improves efficiency of the color reproduction and imaging that are of the image sensor.

Figure 5:
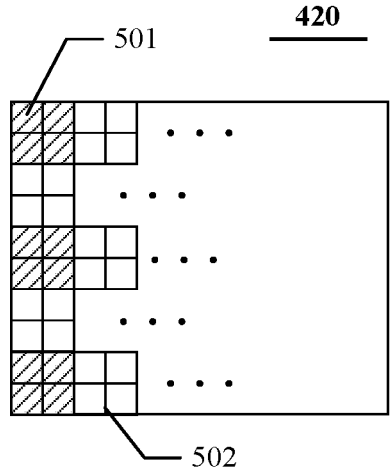
FIG. 5 is a first schematic diagram of a structure of a color filter array in an image sensor according to an embodiment of this application.

FIG. 5 is a first schematic diagram of a structure of a color filter array in an image sensor according to an embodiment of this application. As shown in FIG. 5, the color filter array 420 includes a plurality of color filter elements, the plurality of color filter elements include at least one first color filter element 501 and at least one second color filter element 502, each first color filter element 501 includes a basic color filter and an extended color filter, and each second color filter element 502 includes a plurality of basic color filters.

More color filter elements in the color filter array indicate higher resolution, and fewer color filter elements in the color filter array indicate lower resolution. More color types of the color filter in the color filter element indicate a larger quantity of channels of the color filter element, and fewer color types of the color filter in the color filter element indicate a smaller quantity of channels of the color filter element. A larger quantity of the color filters in the color filter element indicates more color filters that are of more colors and that can be included in the color filter element. When a quantity of color filters in the color filter array is fixed, a larger quantity of color filter elements indicates a smaller quantity of color filters in the color filter element, and a smaller quantity of color filter elements indicates a larger quantity of color filters in the color filter element. Therefore, the quantity of color filter elements and the quantity of color filters in the color filter element may be set based on requirements for resolution and a quantity of channels of the color filter element.

It should be noted that, if the color filter element is the first color filter element 501, the quantity of color filters in the color filter element is a sum of a quantity of basic color filters and a quantity of extended color filters in the color filter element. If the color filter element is the second color filter element 502, the quantity of color filters in the color filter element is a quantity of basic color filters in the color filter element.

The quantity of color filters in the first color filter element 501 may be the same as or different from the quantity of color filters in the second color filter element 502.

An optical signal passing through the extended color filter is for spectral measurement, and an optical signal passing through the basic color filter is at least for imaging. Color filters in the second color filter element 502 are all basic color filters, and color filters in the first color filter element 501 include the basic color filter and the extended color filter. Therefore, a quantity of first color filter elements 501 in the plurality of color filter elements, a quantity of second color filter elements 502 in the plurality of color filter elements, and the quantity of extended color filters in the first color filter element 501 are determined based on requirements of an imaging effect and the spectral measurement. The quantity of extended color filters in the first color filter element 501 is at least one.

For example, a quantity of basic color filters in each first color filter element 501 is 3, a quantity of extended color filters in each first color filter element 501 is 1, and a quantity of basic color filters in each second color filter element 502 is 4.

Colors of the basic color filters in the second color filter element 502 and a quantity of color types are determined based on an imaging requirement. The quantity of color types of the basic color filters in the second color filter element 502 may be, for example, 3, 4, or more. This is not specifically limited in this application. For example, colors of the basic color filters in the second color filter element 502 may include three or four or more of red, green, blue, yellow, magenta, near-infrared color, and the like. This is not specifically limited in this application.

The quantity of color types of the basic color filters in the second color filter element 502 is equal to or less than the quantity of the basic color filters in the second color filter element 502. Specifically, if the quantity of color types of the basic color filters in the second color filter element 502 is equal to the quantity of basic color filters in the second color filter element 502, colors of different basic color filters in the second color filter element 502 are different. If the quantity of color types of the basic color filters in the second color filter element 502 is less than the quantity of basic color filters in the second color filter element 502, colors of some basic color filters in the second color filter element 502 are the same.

A quantity of channels of the second color filter element 502 is equal to the quantity of color types of the basic color filters in the second color filter element 502. For example, if the colors of the basic color filters in the second color filter element 502 include red, green, and blue, the quantity of channels of the second color filter element 502 is 3. If the colors of the basic color filters in the second color filter element 502 include red, yellow, green, and blue, the quantity of channels of the second color filter element 502 is 4.

The basic color filter in the first color filter element 501 is a part of the plurality of basic color filters in the second color filter element 502. Colors of basic color filters in different first color filter elements 501 may be different, or may be incompletely the same, or may be the same. For example, the quantity of basic color filters in the second color filter element 501 is 4, and colors of the four basic color filters are respectively red, green, blue, and yellow. If a quantity of basic color filters in the first color filter element 501 is 3, colors of the three basic color filters in each first color filter element 501 may be red, green, and blue respectively. Clearly, the colors of the basic color filters in different first color filter elements 501 are the same. If a quantity of basic color filters in the first color filter element 501 is 2, colors of two basic color filters in one part of first color filter elements 501 may be red and green respectively, colors of two basic color filters in one part of the first color filter elements 501 may be blue and yellow respectively, and colors of two basic color filters in one part of the first color filter elements 501 may be green and yellow respectively. Clearly, the colors of the basic color filters in different first color filter elements 501 may be the same, different, or partially the same.

Because the color of the basic color filter is different from the color of the extended color filter, the color of the extended color filter is any color other than the color of the basic color filter, and specifically, may be determined based on a spectral measurement requirement.

Colors of different extended color filters in a same first color filter element 501 may be the same, or may be different, or may be incompletely the same. Colors of extended color filters in different first color filter elements 501 may be the same, or may be different, or may be incompletely the same.

For example, the first color filter element 501 includes one extended color filter, and extended color filters in different first color filter elements 501 have different colors. For another example, the first color filter element 501 includes a plurality of extended color filters, colors of different extended color filters in a same first color filter element 501 are different, and colors of extended color filters in different first color filter elements 501 are different. Clearly, in the foregoing two examples, for a color filter array, different extended color filters have different colors.

In the color filter array, more color types of the extended color filter indicate more sampling points. Based on this, in the foregoing two examples, because different extended color filters have different colors, a quantity of sampling points is further increased. Color reproduction precision is improved. Occurrence of a metamerism problem is reduced. Difficulty in calculating a white balance coefficient and a color reproduction matrix is reduced.

A quantity of channels of the first color filter element 501 is a quantity of color types of the basic color filter and the extended color filter that are in the first color filter element 501. The quantity of channels of the first color filter element 501 may be the same as or different from the quantity of channels of the second color filter element 502.

The at least one first color filter element 501 and the at least one second color filter element 502 are arranged in N rows and M columns. N and M may be the same or may be different, and both N and M are integers greater than or equal to 1. The first color filter element 501 may be regularly distributed in N rows and M columns, or the first color filter element 501 may be randomly distributed in N rows and M columns. This is not specifically limited in this application.

An extended color filter may be located at any location in a first color filter element 501 to which the extended color filter belongs, or an extended color filter may be located at a fixed location in a first color filter element 501 to which the extended color filter belongs.

It should be noted that location information of the extended color filter further needs to be recorded for subsequent data processing. Specifically, if the extended color filter is regularly distributed in the color filter array, a location of the Pt extended color filter and a distribution rule of the extended color filter are recorded. In this way, a location of each extended color filter can be determined based on the location of the Pt extended color filter and the distribution rule. If the extended color filter is randomly distributed in the color filter array, a location of each extended color filter needs to be recorded.

Figure 6:
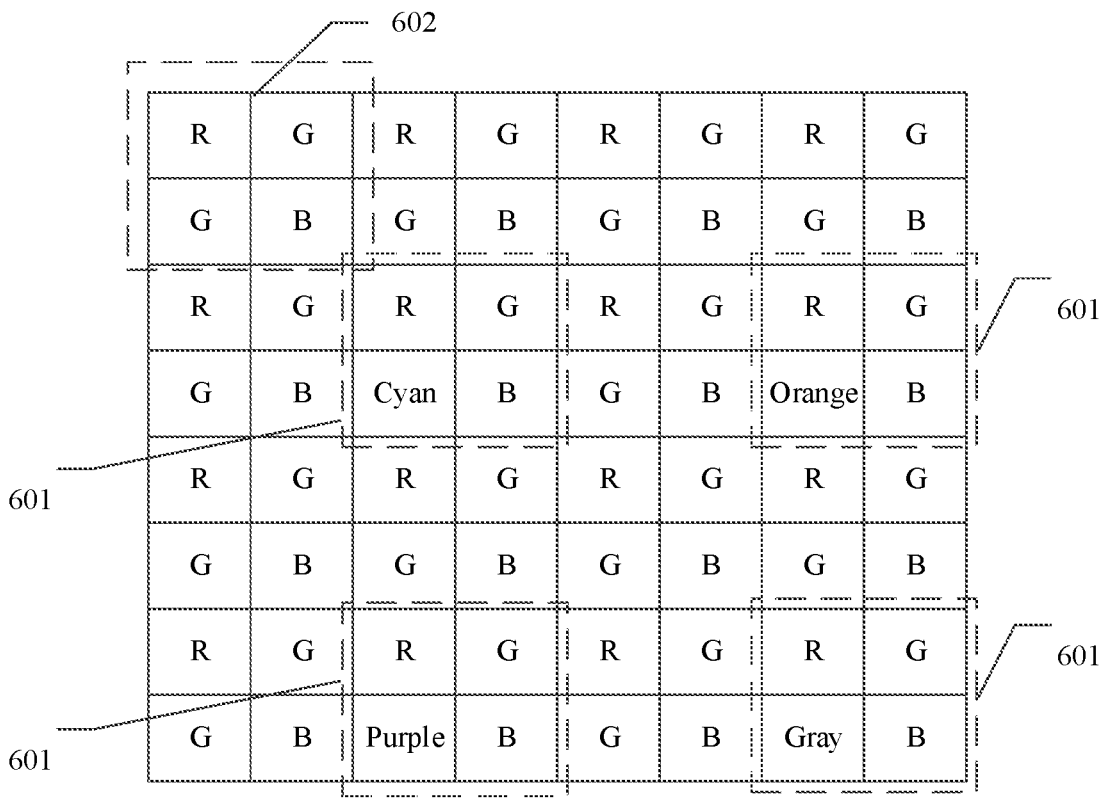
FIG. 6 is a second schematic diagram of a structure of a color filter array in an image sensor according to an embodiment of this application.

FIG. 6 is a second schematic diagram of a structure of a color filter array in an image sensor according to an embodiment of this application. As shown in FIG. 6, the color filter array includes 16 color filter elements. The 16 color filter elements include 4 first color filter elements 601 and 12 second color filter elements 602. Each first color filter element 601 includes three basic color filters and one extended color filter element. Each second color filter element 602 includes four basic color filters.

Colors of the four basic color filters in each second color filter element 602 are respectively RGGB (red, green, green, and blue). Colors of the three basic color filters in each first color filter element 601 are respectively RGB (red, green, and blue). Colors of extended color filters in different first color filter elements 601 are different, and colors of extended color filters in the four first color filter elements 501 are respectively cyan, orange, purple, and gray.

It can be learned from the above that, because the second color filter element 602 includes basic color filters of three colors, a quantity of channels of the second color filter element 602 is 3. The first color filter element 601 includes basic color filters of three colors and an extended color filter of one color. Therefore, a quantity of channels of the first color filter element 601 is 4.

Figure 7:
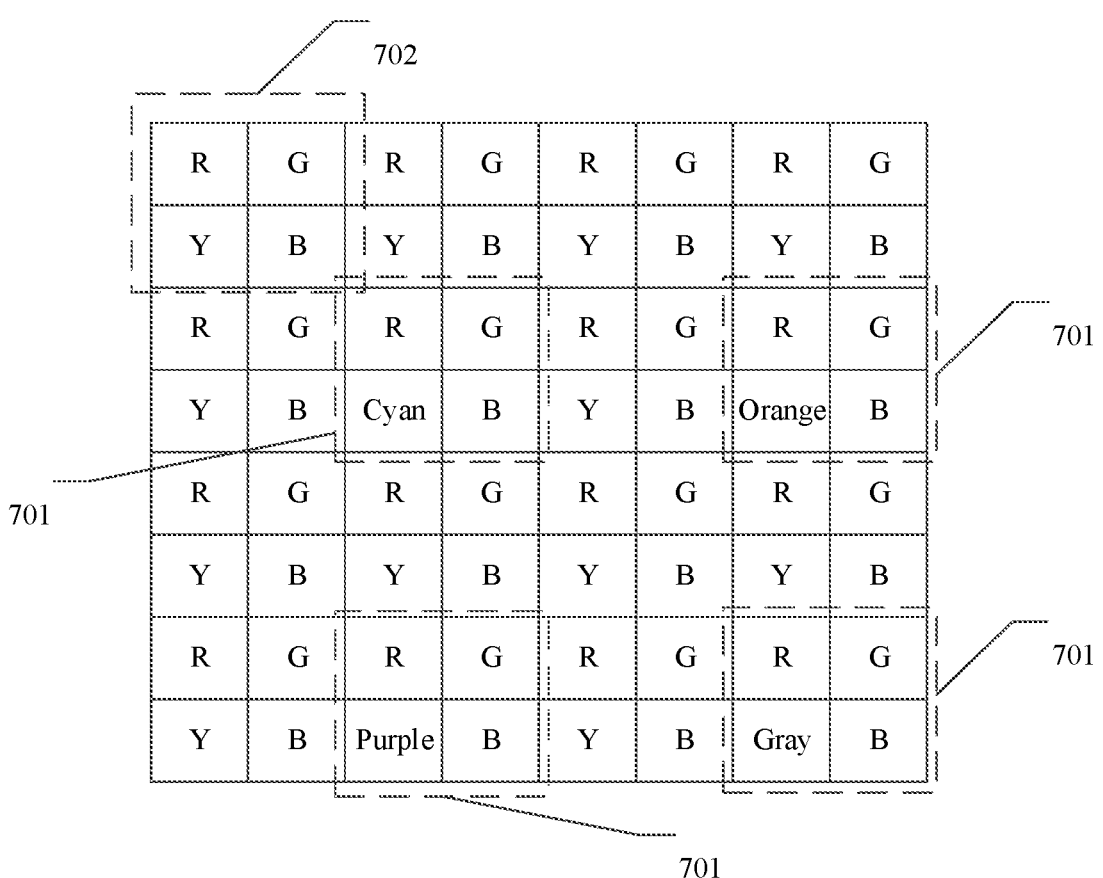
FIG. 7 is a third schematic diagram of a structure of a color filter array in an image sensor according to an embodiment of this application.

FIG. 7 is a third schematic diagram of a structure of a color filter array in an image sensor according to an embodiment of this application. A difference between the color filter array in FIG. 7 and the color filter array in FIG. 6 is that colors of four basic color filters in each second color filter element 702 are respectively RGYB (red, green, yellow, and blue). Colors of the three basic color filters in each first color filter element 701 are respectively RGB (red, green, and blue).

It can be learned from the above that, because the second color filter element 702 includes basic color filters of four colors, a quantity of channels of the second color filter element 702 is 4. The first color filter element 701 includes basic color filters of three colors and an extended color filter of one color. Therefore, a quantity of channels of the first color filter element 701 is 4.

It should be noted that the descriptions of the color filter array in FIG. 6 and FIG. 7 are merely examples, and are not intended to limit this application.

Because a dynamic range of a common image sensor is limited, both a dynamic range of an object with higher illumination and a dynamic range of an object with lower illumination cannot be considered. This results in a poor imaging effect. A typical scenario that the imaging effect is poor due to a limited dynamic range is as follows.

Both a light source and an object appear in a shooting scenario. Illumination of the light source is higher, and illumination of the object is lower. Therefore, if the light source is focused, details of the light source can be clearly displayed in an image, but details of the object are lost. If the object is focused, details of the object can be clearly displayed in an image, but the light source may be overexposed.

To resolve the technical problem, the extended color filter in the color filter array is improved in this application. A principle of the improvement is as follows.

Photon accumulation of a pixel is reduced, so that overexposure can be avoided. The photon accumulation of the pixel is increased, so that a signal-to-noise ratio can be improved, and loss of details of an object is avoided. In addition, because at least one of an effective area of a pixel, exposure time of the pixel, and a thickness of a color filter that covers the pixel changes, a photon accumulation status of the pixel changes. Therefore, in this application, a part of the extended color filter in the color filter array may be used as a first extended color filter, and the other part of the extended color filter may be used as a second extended color filter. Then, a dynamic range of an image sensor is determined based on dynamic ranges of a brightest object and a darkest object in a scenario in which the image sensor is used. For example, a union set of the dynamic ranges of the brightest object and the darkest object is obtained, a maximum value of the union set is determined as an upper limit of the dynamic range of the image sensor, and a minimum value of the union set is determined as a lower limit of the dynamic range of the image sensor. Finally, at least one of a thickness of the first extended color filter, an effective area of a pixel covered by the first extended color filter, and exposure time of the pixel covered by the first extended color filter is determined based on the upper limit of the dynamic range of the image sensor. At least one of a thickness of the second extended color filter, exposure time of a pixel covered by the second extended color filter, and an effective area of the pixel covered by the second extended color filter is determined based on the lower limit of the dynamic range of the image sensor.

The thickness of the extended color filter is negatively correlated with a photon accumulation effect of the pixel. The exposure time of the pixel is positively correlated with the photon accumulation effect of the pixel, and the effective area of the pixel is positively correlated with the photon accumulation effect of the pixel.

Manners of reducing the effective area of the pixel include: reducing a fill factor, semi-blocking, and the like.

It can be learned from the above that, the dynamic range of the image sensor may be determined based on an application scenario, and related parameters that are of the first extended color filter, the pixel covered by the first extended color filter, the second extended color filter, and the pixel covered by the second extended color filter may be determined based on the upper limit and the lower limit of the dynamic range of the image sensor. In this way, the dynamic range of the image sensor is not limited, to consider both a dynamic range of an object with higher illumination and a dynamic range of an object with lower illumination. This improves an imaging effect.

Figure 8:
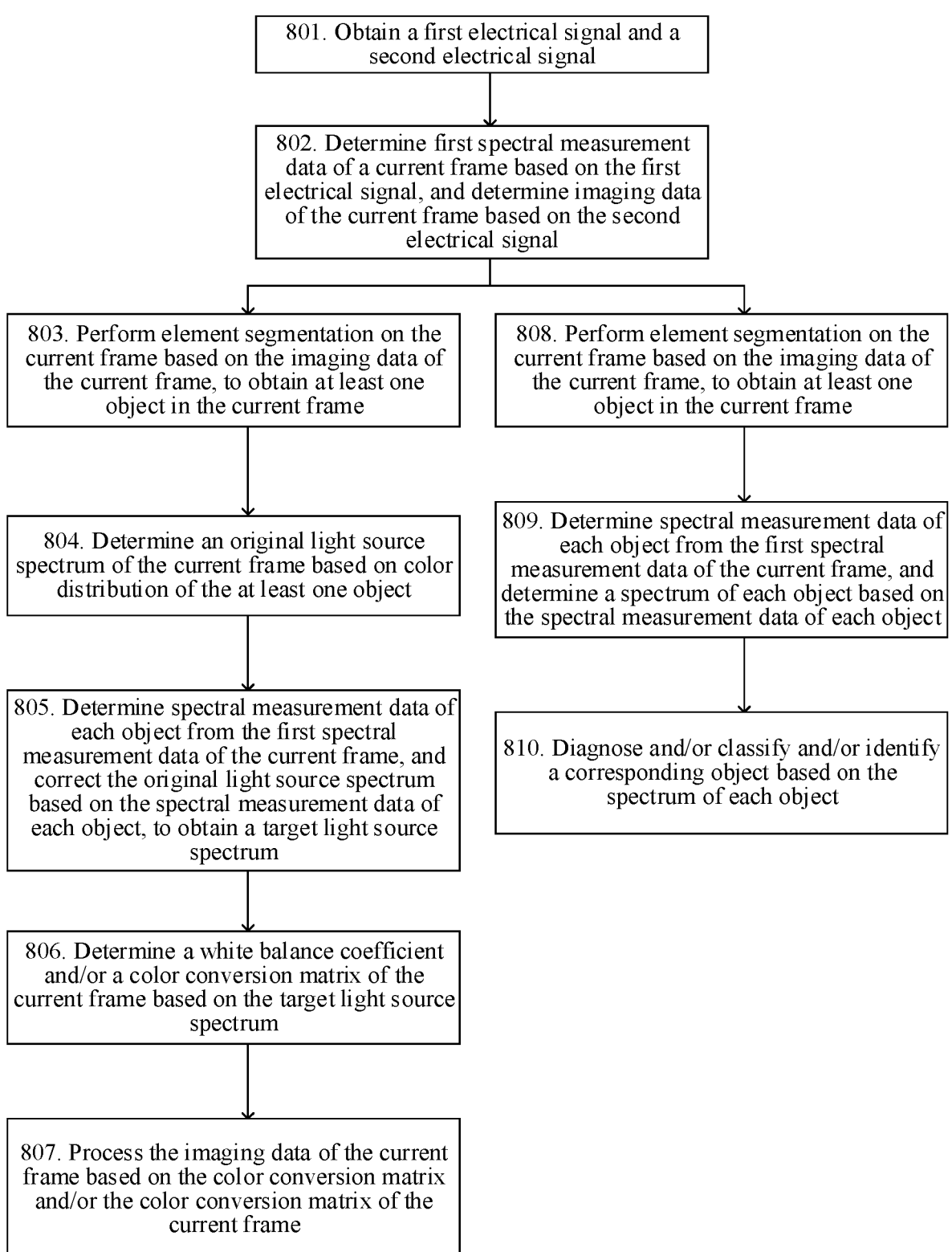
FIG. 8 is a schematic diagram of a working procedure of an image processor according to an embodiment of this application.

The following describes a working procedure of an image processor with reference to FIG. 8. As shown in FIG. 8, the working procedure of the image processor includes the following steps.

801. Obtain a first electrical signal and a second electrical signal.

For example, an image sensor obtains the first electrical signal and the second electrical signal from a signal read out by a readout circuit.

A process of obtaining the first electrical signal and the second electrical signal may be: obtaining the first electrical signal based on a location of an extended color filter in a color filter array, and obtaining the second electrical signal based on a location of a basic color filter in the color filter array. Specifically, a location of a first pixel in a pixel array is determined based on the location of the extended color filter in the color filter array. The first electrical signal is obtained, based on the location of the first pixel in the pixel array, from the electrical signal read out by the readout circuit from the pixel array. Similarly, a location of a second pixel in the pixel array is determined based on the location of the basic color filter in the color filter array. The second electrical signal is obtained, based on the location of the second pixel in the pixel array, from the electrical signal read out by the readout circuit from the pixel array.

802. Determine first spectral measurement data of a current frame based on the first electrical signal, and determine imaging data of the current frame based on the second electrical signal.

For example, a process of determining the imaging data of the current frame based on the second electrical signal may be as follows.

The second electrical signal read from the second pixel is converted from the electrical signal into a pixel value, to obtain a pixel value of the second pixel. The pixel value of the second pixel and the location of the second pixel in the pixel array are determined as the imaging data of the current frame.

In another possible implementation of this application, after the imaging data is obtained, the imaging data may further be preprocessed. The preprocessing herein includes but is not limited to one or more of black level correction, lens correction, bad pixel compensation, and the like. The preprocessed imaging data is determined as the imaging data obtained in step 802.

It can be learned from the above that the imaging data of the current frame may be imaging data before preprocessing, or may be imaging data after preprocessing.

For example, manners of determining the first spectral measurement data of the current frame based on the first electrical signal may include the following four manners.

In a first manner, the first electrical signal read from the first pixel is converted from the electrical signal into a pixel value, to obtain a pixel value of the first pixel. The pixel value of the first pixel and the location of the first pixel in the pixel array are determined as the first spectral measurement data of the current frame.

In a second manner, motion information of the current frame relative to a history frame is first determined based on the imaging data of the current frame and imaging data of the history frame.

The history frame is any frame before the current frame. For example, the history frame is a video frame that is before the current frame and that is adjacent to the current frame.

The imaging data of the history frame may be original imaging data. The original imaging data includes a pixel value of the second pixel and a location of the second pixel in the pixel array that are obtained when the history frame is photographed. The imaging data of the history frame may alternatively be data obtained by performing the foregoing preprocessing and/or white balance coefficient processing and/or color conversion matrix processing on the original imaging data of the history frame.

A process of determining the motion information of the current frame relative to the history frame may include: calculating, based on the pixel value of the second pixel and the location of the second pixel in the pixel array in the imaging data of the current frame, and the location of the second pixel in the pixel array and the pixel value of the second pixel in the imaging data of the history frame, a difference between locations that are of a second pixel indicating a same element and that correspond to the current frame and the history frame, calculating an average value of differences between locations that are of all second pixels indicating a same element and that correspond to the current frame and the history frame, and determining the average value as the motion information of the current frame relative to the history frame. The element includes but is not limited to semantics and a feature. It should be noted that the foregoing manner of determining the motion information of the current frame relative to the history frame is merely an example, and is not intended to limit this application.

Then, second spectral measurement data of the current frame is determined based on the first electrical signal. The second spectral measurement data herein may be understood as the first spectral measurement data in the first manner.

Finally, the second spectral measurement data of the current frame is corrected based on the motion information of the current frame relative to the history frame and spectral measurement data of the history frame, to obtain the first spectral measurement data of the current frame.

The spectral measurement data of the history frame may be original spectral measurement data of the history frame. The original spectral measurement data includes a pixel value of the first pixel and a location of the first pixel in the pixel array that are obtained when the history frame is photographed. The spectral measurement data of the history frame may alternatively be data obtained by processing the original spectral measurement data. The processing herein includes but is not limited to: correcting the original spectral measurement data of the history frame based on spectral measurement data of a video frame before the history frame, and performing black level correction, lens correction, bad pixel compensation, and the like on the original spectral measurement data of the history frame.

For example, a process of correcting the second spectral measurement data of the current frame may be: Based on the motion information, first pixels that indicate a same element in the history frame and the current frame are aligned, and pixel values of the aligned first pixels in the history frame and the current frame are averaged. The average value is determined as a correction pixel value of the first pixel in the current frame. A pixel value of the aligned first pixel in the second spectral measurement data of the current frame is replaced with the correction pixel value, to obtain the first spectral measurement data of the current frame. It should be noted that the foregoing process of correcting the second spectral measurement data of the current frame is merely an example, and is not intended to limit this application.

In a third manner, the first spectral measurement data is generated based on at least a part of the second electrical signal and the first electrical signal.

The at least a part of the second electrical signal is the second electrical signal read from the at least a part of the second pixel. The at least a part of the second pixel is all second pixels or some second pixels. One part of the second pixel may be, for example, a second pixel located around the first pixel.

The first electrical signal read from the first pixel is converted from the electrical signal into a pixel value, to obtain the pixel value of the first pixel. The at least a part of the second electrical signal read from the second pixel is converted from the electrical signal into the pixel value, to obtain a pixel value of the at least a part of the second pixel. The pixel value of the first pixel and the location of the first pixel in the pixel array, and the pixel value of the at least a part of the second pixel and a location of the at least a part of the second pixel in the pixel array are determined as the first spectral measurement data.

In a fourth manner, motion information of the current frame relative to a history frame is first determined based on the imaging data of the current frame and imaging data of the history frame. Because the process has been described above, details are not described herein again.

Then second spectral measurement data of the current frame is generated based on at least a part of the second electrical signal and the first electrical signal. The second spectral data herein may be understood as the first spectral measurement data in the third manner.

Finally, the second spectral measurement data of the current frame is corrected based on the motion information and spectral measurement data of the history frame, to obtain the first spectral measurement data of the current frame. The spectral measurement data of the history frame may be original spectral measurement data of the history frame. The original spectral measurement data includes a pixel value of the first pixel and a location of the first pixel in the pixel array, and a pixel value of the at least a part of the second pixel and a location of the at least a part of the second pixel in the pixel array that are obtained when the history frame is photographed. The spectral measurement data of the history frame may alternatively be data obtained by processing the original spectral measurement data. The processing herein includes but is not limited to: correcting the original spectral data of the history frame based on spectral measurement data of a video frame before the history frame, and performing black level correction, lens correction, bad pixel compensation, and the like on the original spectral measurement data of the history frame.

Because a principle of correcting the second spectral data of the current frame based on the motion information and the spectral measurement data of the history frame has been described above, details are not described herein again.

In another possible implementation of this application, after the first spectral measurement data is obtained, the first spectral measurement data may further be preprocessed. The preprocessing herein includes but is not limited to one or more of black level correction, lens correction, bad pixel compensation, and the like. The preprocessed first spectral measurement data is determined as the first spectral measurement data obtained in step 802.

It can be learned from the above that the first spectral measurement data of the current frame may be first spectral measurement data before preprocessing, or may be first spectral measurement data after preprocessing.

It should be noted that, in a case in which the first spectral measurement data of the current frame is the preprocessed first spectral measurement data, for the second manner and the fourth manner, a preprocessing process may be further performed after the second spectral measurement data is obtained. To be specific, after the second spectral measurement data is obtained, the foregoing preprocessing is performed on the second spectral measurement data, and subsequent processing is performed based on the second spectral measurement data obtained through the preprocessing.

In the foregoing second and fourth manners, the second spectral measurement data of the current frame is corrected based on the spectral measurement data of the history frame, to obtain the first spectral measurement data of the current frame, that is, the second spectral measurement data of the current frame is corrected by using a multi-frame noise reduction manner, thereby improving accuracy of the first spectral measurement data, improving color reproduction precision, and improving calculation accuracy of a white balance coefficient and color conversion precision.

In conclusion, both the imaging data and the first spectral measurement data that are of the current frame can be obtained through one exposure, to shorten time consumed for data collection. In addition, because sampling points of the image sensor to which the image data obtaining method is applied are increased, color reproduction precision is improved, and difficulty in calculating a white balance coefficient and color conversion precision is reduced.

After the first spectral measurement data of the current frame is obtained, application scenarios of the first spectral measurement data include the following two types.

In a first scenario, the white balance coefficient and/or the color conversion matrix are/is calculated based on the first spectral measurement data and the imaging data that are of the current frame, to process the imaging data of the current frame by using the white balance coefficient and/or the color conversion matrix, to improve the color reproduction precision and further improve a display effect. A specific execution procedure is as follows.

803. Perform element segmentation on the current frame based on the imaging data of the current frame, to obtain at least one object in the current frame.

The element includes but is not limited to semantics and a feature. For example, the element segmentation may be implemented by using a model formed by a neural network. The object includes but is not limited to a person, an animal, a flower, grass, cloud, a blue sky, a table, a house, a face, a white block, a gray block, and the like.

804. Determine an original light source spectrum of the current frame based on color distribution of the at least one object. Specifically, the color distribution of the at least one object is analyzed based on the imaging data of the current frame and a location of each object. A color temperature of an original light source of the current frame is evaluated based on the color distribution. The original light source spectrum is determined based on the color temperature of the original light source.

805. Determine spectral measurement data of each object from the first spectral measurement data of the current frame, and correct the original light source spectrum based on the spectral measurement data of each object, to obtain a target light source spectrum.

A process of determining the spectral measurement data of the object may be: determining a location of a boundary pixel of the object, and determining, based on a location of a pixel in the first spectral measurement data of the current frame, a pixel value and a location that are of a pixel located inside the boundary pixel of the object and that are in the first spectral measurement data as the spectral measurement data of the object.

A process of obtaining the target light source spectrum may be: analyzing the color distribution of the at least one object based on the spectral measurement data of each object, determining a corrected color temperature based on the color distribution, and determining a corrected spectrum based on the corrected color temperature. The original light source spectrum is corrected based on the corrected spectrum, to obtain the target light source spectrum.

A light source spectrum indicates distribution of a photometric quantity or a radiometric quantity of each wavelength in the light source.

The foregoing process of determining the target light source spectrum is merely an example, and is not intended to limit this application. For example, alternatively, after the color temperature of the original light source is determined, the corrected color temperature may be determined. Then, the color temperature of the original light source is corrected based on the corrected color temperature, to obtain a color temperature of a target light source. Finally, the target light source spectrum is determined based on the color temperature of the target light source. For another example, alternatively, after the at least one object in the current frame is obtained, imaging data of each object and spectral measurement data of each object may be determined. Then, imaging data of a corresponding object is corrected based on the spectral measurement data of each object, to obtain target imaging data of each object. Finally, color analysis of the at least one object is determined based on the target imaging data of each object. A color temperature of a target light source is evaluated based on the color distribution. The target light source spectrum is determined based on the color temperature of the target light source.

806. Determine a white balance coefficient and/or a color conversion matrix of the current frame based on the target light source spectrum.

807. Process the imaging data of the current frame based on the color conversion matrix and/or the color conversion matrix of the current frame.

For example, if the current frame is an RGB image, to be specific, the second color filter element in the color filter array in the image sensor is a three-channel RGB, a process of processing the imaging data by using the white balance coefficient is as follows:

$$\begin{pmatrix} R \\ G \\ B \end{pmatrix} = \begin{pmatrix} Rg \\ Gg \\ Bg \end{pmatrix} \times \begin{pmatrix} r \\ g \\ b \end{pmatrix}^{T}$$

R is a processed pixel value of a pixel covered by a red basic color filter. G is a processed pixel value of a pixel covered by a green basic color filter. B is a processed pixel value of a pixel covered by a blue basic color filter. Rg is a pixel value of the pixel covered by the red basic color filter. Gg is a pixel value of the pixel covered by the green basic color filter. Bg is a pixel value of the pixel covered by the blue basic color filter, and r, g, and b are white balance coefficients.

A principle of processing the imaging data by using the color conversion matrix is as follows:

$$\begin{pmatrix} sR \\ sG \\ sB \end{pmatrix} = \begin{pmatrix} a & d & g \\ b & e & h \\ c & f & i \end{pmatrix} \times \begin{pmatrix} Rg \\ Gg \\ Bg \end{pmatrix}$$

sR is a processed pixel value of a pixel covered by a red basic color filter. sG is a processed pixel value of a pixel covered by a green basic color filter. sB is a processed pixel value of a pixel covered by a blue basic color filter. Rg is a pixel value of the pixel covered by the red basic color filter. Gg is a pixel value of the pixel covered by the green basic color filter. Bg is a pixel value of the pixel covered by the blue basic color filter, and a, b, c, d, e, f, g, h and i are parameters in the color conversion matrix.

It should be noted that, in another embodiment of this application, a local light source spectrum and a local color conversion matrix of the current frame may be further obtained according to the foregoing principle, to process a local part of the current frame by using the local light source spectrum and the local color conversion matrix.

It can be learned from the above that, the sampling points increase, so that the imaging data and the first spectral measurement data reflect information about more sampling points. In this way, the original light source spectrum of the current frame is determined based on the imaging data, and the target light source spectrum obtained by correcting the original light source spectrum based on the spectral measurement data of each object reflects information about more sampling points. This improves accuracy of the target light source spectrum, and reduces occurrence of a metamerism problem. In this way, the difficulty of calculating the white balance coefficient and the color conversion matrix is reduced, and the color reproduction precision is improved.

In a second scenario, an object in the current frame is diagnosed and/or classified and/or identified based on the first spectrum test data of the current frame. A specific execution procedure is as follows.

808. Perform element segmentation on the current frame based on the imaging data of the current frame, to obtain at least one object in the current frame. Because this step has been described above, details are not described herein again.

809. Determine spectral measurement data of each object from the first spectral measurement data of the current frame, and determine a spectrum of each object based on the spectral measurement data of each object.

The process of determining the spectral measurement data of each object has been described above, and details are not described herein again. For example, a process of determining a spectrum of an object may be: analyzing color distribution of the object based on spectral measurement data of the object, evaluating a color temperature of the object based on the color distribution, and determining the spectrum of the object based on the color temperature of the object.

The spectrum of the object is distribution of a photometric quantity or a radiometric quantity of each wavelength reflected by the object.

810. Diagnose and/or classify and/or identify a corresponding object based on the spectrum of each object.

For the diagnosis of the object, spectrums of the object corresponding to different diagnosis results may be obtained in advance, the spectrum of the object is matched with the spectrums of the object corresponding to different diagnosis results, and a diagnosis result of the object is determined based on a matching result.

For the classification of the object, spectrums of the object corresponding to different classification results may be obtained in advance, the spectrum of the object is matched with the spectrums of the object corresponding to different classifications, and a classification result of the object is determined based on a matching result.

For the identification of the object, a spectrum of each object may be obtained in advance, the spectrum of the object is matched with the spectrum of each object, and an identification result of the object is determined based on a matching result.

It should be noted that the foregoing spectrum matching may be spectrum matching on a mathematical feature (for example, an average value, a variance, or statistical distribution).

It can be learned from the above that, the spectrum of each object in the current frame is determined, so that the object may be diagnosed and/or classified and/or identified based on the spectrum of the object. The manner is simple and easy to execute. In addition, a user can also quickly and accurately diagnose and/or classify and/or identify the object in the foregoing manner. This improves user experience.

This application further provides an image data obtaining method, applied to the foregoing image sensor. The image data obtaining method includes the following steps.

First, obtain a first electrical signal and a second electrical signal. Then, determine first spectral measurement data of a current frame based on the first electrical signal, and determine imaging data of the current frame based on the second electrical signal.

The first electrical signal is an electrical signal obtained by performing optical-to-electrical conversion on a first optical signal by a first pixel, the first optical signal is an optical signal that passes through an extended color filter, the first pixel is a pixel covered by the extended color filter, the second electrical signal is an electrical signal obtained by performing optical-to-electrical conversion on a second optical signal by a second pixel, the second optical signal is an optical signal that passes through a basic color filter, and the second pixel is a pixel covered by the basic color filter.

In a possible implementation, the determining first spectral measurement data of a current frame based on the first electrical signal includes: determining motion information of the current frame relative to a history frame based on imaging data of the current frame and imaging data of the history frame; determining second spectral measurement data of the current frame based on the first electrical signal; and correcting the second spectral measurement data based on the motion information and spectral measurement data of the history frame, to obtain the first spectral measurement data.

In a possible implementation, the determining first spectral measurement data of a current frame based on the first electrical signal includes: generating the first spectral measurement data based on at least a part of the second electrical signal and the first electrical signal.

In a possible implementation, the determining first spectral measurement data of a current frame based on the first electrical signal includes: determining motion information of the current frame relative to a history frame based on the imaging data of the current frame and imaging data of the history frame; generating second spectral measurement data of the current frame based on at least a part of the second electrical and the first electrical signal; and correcting the second spectral measurement data based on the motion information and spectral measurement data of the history frame, to obtain the first spectral measurement data.

In a possible implementation, the obtaining a first electrical signal and a second electrical signal includes: obtaining the first electrical signal based on a location of the extended color filter in a color filter array; and obtaining the second electrical signal based on a location of the basic color filter in the color filter array.

In a possible implementation, the method further includes: performing element segmentation on the current frame based on the imaging data of the current frame to obtain at least one object in the current frame; determining an original light source spectrum of the current frame based on color distribution of the at least one object; determining spectral measurement data of each object from the first spectral measurement data of the current frame, and correcting the original light source spectrum based on the spectral measurement data of each object, to obtain a target light source spectrum; determining a white balance coefficient and/or a color conversion matrix of the current frame based on the target light source spectrum; and processing the imaging data of the current frame based on the white balance coefficient and/or the color conversion matrix of the current frame.

In a possible implementation, the method further includes: performing element segmentation on the current frame based on the imaging data of the current frame to obtain the at least one object in the current frame; determining the spectral measurement data of each object from the first spectral measurement data of the current frame, and determining a spectrum of each object based on the spectral measurement data of each object; and diagnosing and/or classifying and/or identifying a corresponding object based on the spectrum of each object.

An implementation principle and a technical effect of the foregoing image data obtaining method in this application have been described above, and details are not described herein again.

This application further provides a computer-readable storage medium, including a computer program. When the computer program is executed on a computer, the computer is enabled to perform the technical solution in any one of the foregoing method embodiments.

This application further provides a computer program. When the computer program is executed by a computer or a processor, the computer or the processor is configured to perform the technical solution in any one of the foregoing method embodiments.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiments are merely examples. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electronic, a mechanical, or another form.

The units described as separate parts may or may not be physically separate, and parts displayed as units may or may not be physical units, may be located in one location, or may be distributed on a plurality of network units. Some or all of the units may be selected based on actual requirements to achieve the objectives of the solutions of embodiments.

In addition, functional units in embodiments of this application may be integrated into one processing unit, each of the units may exist independently physically, or two or more units may be integrated into one unit.

When the functions are implemented in the form of a software functional unit and sold or used as an independent product, the functions may be stored in a computer-readable storage medium. Based on such an understanding, the technical solutions in this application essentially, or the part contributing to a conventional technology, or some of the technical solutions may be implemented in a form of a software product. The computer software product is stored in a storage medium, and includes several instructions for instructing a computer device (a personal computer, a server, a network device, or the like) to perform all or a part of the steps of the methods in embodiments of this application. The foregoing storage medium includes any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An image sensor, comprising a pixel array and a color filter array covering the pixel array, wherein the color filter array comprises a plurality of color filter elements, the plurality of color filter elements comprise at least one first color filter element and at least one second color filter element, each of the at least one first color filter element comprises a basic color filter and an extended color filter, and each of the at least one second color filter element comprises a plurality of basic color filters, wherein a color of the extended color filter is different from a color of the basic color filter, wherein the color of the extended color filter is determined based on a spectral measurement requirement, an optical signal passing through the basic color filter is at least for imaging, and an optical signal passing through the extended color filter is for spectral measurement.

2. The image sensor according to claim 1, wherein there are three basic color filters in each of the at least one first color filter element, one extended color filter in each of the at least one first color filter element, and four basic color filters in each of the at least one second color filter element.

3. The image sensor according to claim 2, wherein colors of the basic color filters in each of the at least one second color filter element comprise red, green, and blue, and colors of the basic color filters in each of the at least one first color filter element comprise red, green, and blue.

4. The image sensor according to claim 1, wherein different extended color filters have different colors.

5. The image sensor according to claim 1, wherein the extended color filter comprises a first extended color filter and a second extended color filter, wherein at least one of a thickness of the first extended color filter, an effective area of a pixel covered by the first extended color filter, or exposure time of the pixel covered by the first extended color filter is determined based on an upper limit of a dynamic range of the image sensor; and at least one of a thickness of the second extended color filter, an effective area of a pixel covered by the second extended color filter, or exposure time of the pixel covered by the second extended color filter is determined based on a lower limit of the dynamic range of the image sensor.

6. An image data obtaining method, applied to an image sensor, wherein the image sensor comprises a pixel array and a color filter array covering the pixel array, wherein the color filter array comprises a plurality of color filter elements, the plurality of color filter elements comprise at least one first color filter element and at least one second color filter element, each of the at least one first color filter element comprises a basic color filter and an extended color filter, each of the at least one second color filter element comprises a plurality of basic color filters, and a color of the extended color filter is different from a color of the basic color filter; and the method comprises:

obtaining a first electrical signal and a second electrical signal;

determining first spectral measurement data of a current frame based on the first electrical signal and wherein the determining first spectral measurement data of a current frame based on the first electrical signal comprises performing spectral measurement correction based on motion information of the current frame relative to a history frame and spectral measurement data of the history frame; and determining imaging data of the current frame based on the second electrical signal, wherein the first electrical signal is an electrical signal obtained by performing optical-to-electrical conversion on a first optical signal by a first pixel, the first optical signal is an optical signal that passes through the extended color filter, the first pixel is a pixel covered by the extended color filter, the second electrical signal is an electrical signal obtained by performing optical-to-electrical conversion on a second optical signal by a second pixel, the second optical signal is an optical signal that passes through the basic color filter, and the second pixel is a pixel covered by the basic color filter.

7. The method according to claim 6, wherein the determining first spectral measurement data of a current frame based on the first electrical signal comprises:

determining the motion information of the current frame relative to the history frame based on the imaging data of the current frame and imaging data of the history frame;

determining second spectral measurement data of the current frame based on the first electrical signal; and correcting the second spectral measurement data based on the motion information and the spectral measurement data of the history frame, to obtain the first spectral measurement data.

8. The method according to claim 6, wherein the determining first spectral measurement data of a current frame based on the first electrical signal comprises:

generating the first spectral measurement data based on at least a part of the second electrical signal and the first electrical signal.

9. The method according to claim 6, wherein the determining first spectral measurement data of a current frame based on the first electrical signal comprises:

determining the motion information of the current frame relative to the history frame based on the imaging data of the current frame and imaging data of the history frame;

generating second spectral measurement data of the current frame based on at least a part of the second electrical signal and the first electrical signal; and correcting the second spectral measurement data based on the motion information and the spectral measurement data of the history frame, to obtain the first spectral measurement data.

10. The method according to claim 6, wherein the obtaining a first electrical signal and a second electrical signal comprises:

obtaining the first electrical signal based on a location of the extended color filter in the color filter array; and obtaining the second electrical signal based on a location of the basic color filter in the color filter array.

11. The method according to claim 6, wherein the method further comprises:

performing element segmentation on the current frame based on the imaging data of the current frame to obtain at least one object in the current frame;

determining an original light source spectrum of the current frame based on color distribution of the at least one object;

determining spectral measurement data of each of the at least one object from the first spectral measurement data of the current frame, and correcting the original light source spectrum based on the spectral measurement data of each of the at least one object, to obtain a target light source spectrum;

determining at least one of a white balance coefficient or a color conversion matrix of the current frame based on the target light source spectrum; and processing the imaging data of the current frame based on at least one of the white balance coefficient or the color conversion matrix of the current frame.

12. The method according to claim 6, wherein the method further comprises:

performing element segmentation on the current frame based on the imaging data of the current frame to obtain at least one object in the current frame;

determining spectral measurement data of each of the at least one object from the first spectral measurement data of the current frame, and determining a spectrum of each of the at least one object based on the spectral measurement data of each of the at least one object; and diagnosing, classifying, or identifying a corresponding object based on the spectrum of each of the at least one object.

13. The method according to claim 6, wherein the extended color filter comprises a first extended color filter and a second extended color filter, wherein at least one of a thickness of the first extended color filter, an effective area of a pixel covered by the first extended color filter, or exposure time of the pixel covered by the first extended color filter is determined based on an upper limit of a dynamic range of the image sensor; and at least one of a thickness of the second extended color filter, an effective area of a pixel covered by the second extended color filter, or exposure time of the pixel covered by the second extended color filter is determined based on a lower limit of the dynamic range of the image sensor.

14. An imaging device, comprising an image sensor and an image processor, wherein the image sensor comprises a pixel array and a color filter array covering the pixel array; the color filter array comprises a plurality of color filter elements, the plurality of color filter elements comprise at least one first color filter element and at least one second color filter element, each of the at least one first color filter element comprises a basic color filter and an extended color filter, each of the at least one second color filter element comprises a plurality of basic color filters, and a color of the extended color filter is different from a color of the basic color filter, wherein the extended color filter is configured to filter an incident optical signal to obtain a first optical signal;

the basic color filter is configured to filter the incident optical signal to obtain a second optical signal;

a first pixel is configured to perform optical-to-electrical conversion on the first optical signal to obtain a first electrical signal, wherein the first pixel is a pixel covered by the extended color filter;

a second pixel is configured to perform optical-to-electrical conversion on the second optical signal to obtain a second electrical signal, wherein the second pixel is a pixel covered by the basic color filter; and the image processor is configured to: obtain the first electrical signal and the second electrical signal, determine first spectral measurement data of a current frame based on the first electrical signal, and determine imaging data of the current frame based on the second electrical signal, wherein the image processor is configured to determine the first spectral measurement data by performing spectral measurement correction based on motion information of the current frame relative to a history frame and spectral measurement data of the history frame.

15. The device according to claim 14, wherein the image processor is configured to determine the first spectral measurement data in the following manners:

determining the motion information of the current frame relative to the history frame based on the imaging data of the current frame and imaging data of the history frame;

determining second spectral measurement data of the current frame based on the first electrical signal; and correcting the second spectral measurement data based on the motion information and the spectral measurement data of the history frame, to obtain the first spectral measurement data.

16. The device according to claim 14, wherein the image processor is configured to determine the first spectral measurement data in the following manner:

generating the first spectral measurement data based on at least a part of the second electrical signal and the first electrical signal.

17. The device according to claim 14, wherein the image processor is configured to determine the first spectral measurement data in the following manners:

determining the motion information of the current frame relative to the history frame based on the imaging data of the current frame and imaging data of the history frame;

generating second spectral measurement data of the current frame based on at least a part of the second electrical signal and the first electrical signal; and correcting the second spectral measurement data based on the motion information and the spectral measurement data of the history frame, to obtain the first spectral measurement data.

18. The device according to claim 14, wherein the image processor is configured to obtain the first electrical signal and the second electrical signal in the following manners:

obtaining the first electrical signal based on a location of the extended color filter in the color filter array; and obtaining the second electrical signal based on a location of the basic color filter in the color filter array.

19. The device according to claim 14, wherein the image processor is further configured to:

perform element segmentation on the current frame based on the imaging data of the current frame to obtain at least one object in the current frame;

determine an original light source spectrum of the current frame based on color distribution of the at least one object;

determine spectral measurement data of each of the at least one object from the first spectral measurement data of the current frame, and correct the original light source spectrum based on the spectral measurement data of each of the at least one object, to obtain a target light source spectrum;

determine at least one of a white balance coefficient or a color conversion matrix of the current frame based on the target light source spectrum; and process the imaging data of the current frame based on at least one of the white balance coefficient or the color conversion matrix of the current frame.

20. The device according to claim 14, wherein the image processor is further configured to:

perform element segmentation on the current frame based on the imaging data of the current frame to obtain at least one object in the current frame;

determine spectral measurement data of each of the at least one object from the first spectral measurement data of the current frame, and determine a spectrum of each of the at least one object based on the spectral measurement data of each of the at least one object; and diagnose, classify, or identify a corresponding object based on the spectrum of each of the at least one object.

* * * * *